United States Patent [19]
Deschamps et al.

[11] Patent Number: 5,903,438
[45] Date of Patent: May 11, 1999

[54] ENCLOSURE FOR ELECTRICAL SWITCHING EQUIPMENT

[75] Inventors: Jean-Christophe Deschamps, Nuits Saint Georges; Francis Schmit, Fontaine les Dijon, both of France

[73] Assignee: Schneider Electric SA, Boulogne-Billancourt, France

[21] Appl. No.: 09/052,983

[22] Filed: Apr. 1, 1998

[30] Foreign Application Priority Data

Apr. 21, 1997 [FR] France ................................. 97 05005

[51] Int. Cl.⁶ ...................................................... H05K 7/14
[52] U.S. Cl. ........................ 361/736; 361/728; 361/822; 361/826; 361/825; 361/752; 174/50.52; 174/50.54; 174/52.1; 174/59; 174/65 R; 439/65; 439/76.1; 379/325; 379/326; 379/328; 379/330; 379/332
[58] Field of Search ..................................... 361/736, 728, 361/748, 822, 826, 825, 752; 174/50.52, 50.54, 52.1, 59, 65 R; 439/65, 76.1; 379/325, 326, 328, 330, 332

[56] References Cited

U.S. PATENT DOCUMENTS

| | | | |
|---|---|---|---|
| 5,032,951 | 7/1991 | Schropp et al. | 361/726 |
| 5,147,981 | 9/1992 | Buet et al. | 174/52.1 |
| 5,235,494 | 8/1993 | Chang et al. | 361/736 |
| 5,398,161 | 3/1995 | Roy | 361/727 |
| 5,692,043 | 11/1997 | Gliga et al. | 379/399 |
| 5,764,490 | 6/1998 | Barbier et al. | 361/823 |

FOREIGN PATENT DOCUMENTS 0 385 200 A2   9/1990   European Pat. Off. .
0 654 960 A1   5/1995   European Pat. Off. .

*Primary Examiner*—Leo P. Picaro
*Assistant Examiner*—David Foster
*Attorney, Agent, or Firm*—Oblon, Spivak, McClelland, Maier & Neustadt, P.C.

[57] ABSTRACT

Enclosure for electrical switching equipment including electrical control or display devices (21) supported on a wall (23) of the enclosure, being accessible from the outside, a processing or control unit (20) for these devices which is housed inside the enclosure, and an electrical interface device (1) between the devices (21) and the unit (20), the interface device (1) being composed of a housing (10) comprising a body (11) that houses a printed circuit board and encloses a row of connection terminals (30) and a connector (61) to connect the printed circuit board to the devices (21) and to unit (20) respectively, characterized in that the interface device (1) comprises an attachment part (12a) installed on the inside of the enclosure wall (23) close to the devices (21), and the terminals (30) on the device (1) are of the quick fit type.

11 Claims, 1 Drawing Sheet

ENCLOSURE FOR ELECTRICAL SWITCHING EQUIPMENT

This invention relates to an enclosure for electrical switching equipment including a processing unit such as a PLC, electrical control or display devices such as push buttons and indicators that may be used or controlled by the processing unit, and an electrical interface device between the processing unit and the electrical devices. The interface device consists of a housing comprising a body that contains a printed circuit board and includes a row of connection terminals and a connector to connect the printed circuit board to the electrical devices and to the processing unit.

Electrical switches are usually placed in the enclosure such that the processing unit and the interface device are contained inside the enclosure, whereas the electrical devices are supported on a wall of the enclosure and are accessible from the outside.

However, with this layout it is necessary to use relatively long electrical connection cables to connect the electrical devices to the interface device.

Furthermore, each electrical device is connected to the terminals of the interface device through at least two connection cables, which has the disadvantage that a marking system is compulsory on the terminals and on the ends of each cable. Consequently, marking takes a long time to put into place and there are non-negligible risks of errors.

Furthermore, a known type of interface device, for example according to patent application FR 95 01646, comprises screw types of connection terminals; consequently the electrical connection between devices on the printed circuit is made with connection cables, the ends of which are inserted and screwed into the terminals. The installer wastes time with this type of wiring.

Consequently, the purpose of the invention is to overcome the disadvantages inherent to the electrical connection layouts used up to now in an enclosure, by providing a solution that can reduce the length of connection cables between the interface device and electrical devices, while adapting simply to the size of the wiring area. It also makes it easy to perform the connection operation, while reducing the number of connection cables and simplifying their marking.

The enclosure according to the invention is characterized by the fact that the interface device is fixed to the enclosure wall close to the electrical devices, and the device terminals are of the fast connection type.

Consequently the layout of the interface device thus incorporated into the electrical devices environment, reduces the length of connection cables and also enables pre-wiring of the electrical devices outside the enclosure environment when its wall is removable.

Furthermore, fast connection terminals make wiring significantly easier and faster.

The following description with respect to the drawings shows up the characteristics and advantages of the invention. In the drawings in the appendix:

Figure 1:
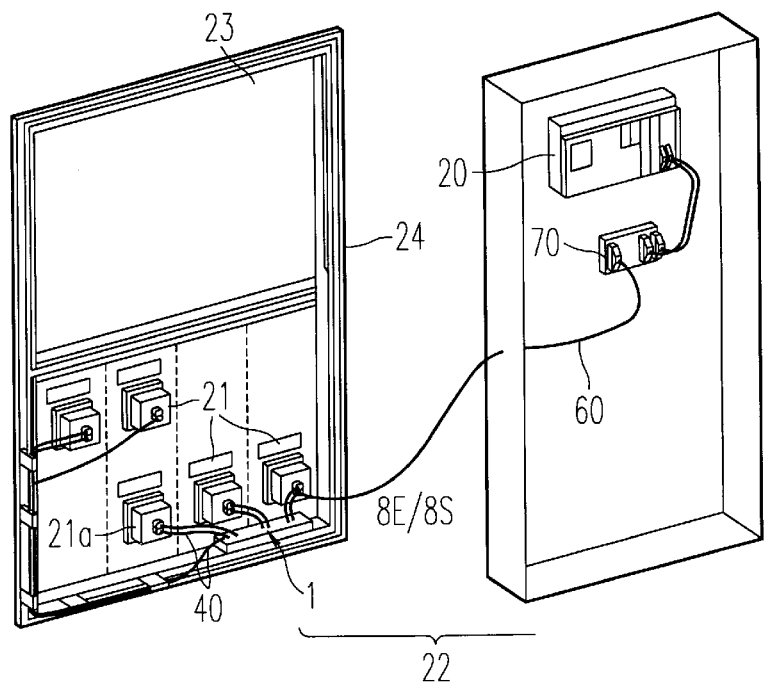
FIG. 1 is an electrical distribution enclosure according to the invention.

The electrical distribution enclosure 22 illustrated in FIG. 1, comprises at least one processing unit 20, for example a programmable logic controller, and electrical devices 21 that may be used or controlled by this unit.

For example, the electrical devices 21 may be composed of display elements such as indicating lights and control elements such as push buttons.

The processing unit 20 is housed inside the enclosure, whereas devices 21 are supported by a wall 23 of the enclosure and are accessible from the outside.

For example, wall 23 may form the enclosure closing panel. On its inside surface, it comprises a rack 24 on which the plates 21a used to support devices 21 are fitted.

Unit 20 and devices 21 are electrically connected through an interface device 1. The electrical connection between the interface device 1 and devices 21 is made using connection cables 40 and between interface device 1 and unit 20 is made using a specially adapted electrical cable 60.

The interface device 1 is designed to be placed on wall 23 close to devices 21.

Figure 2:
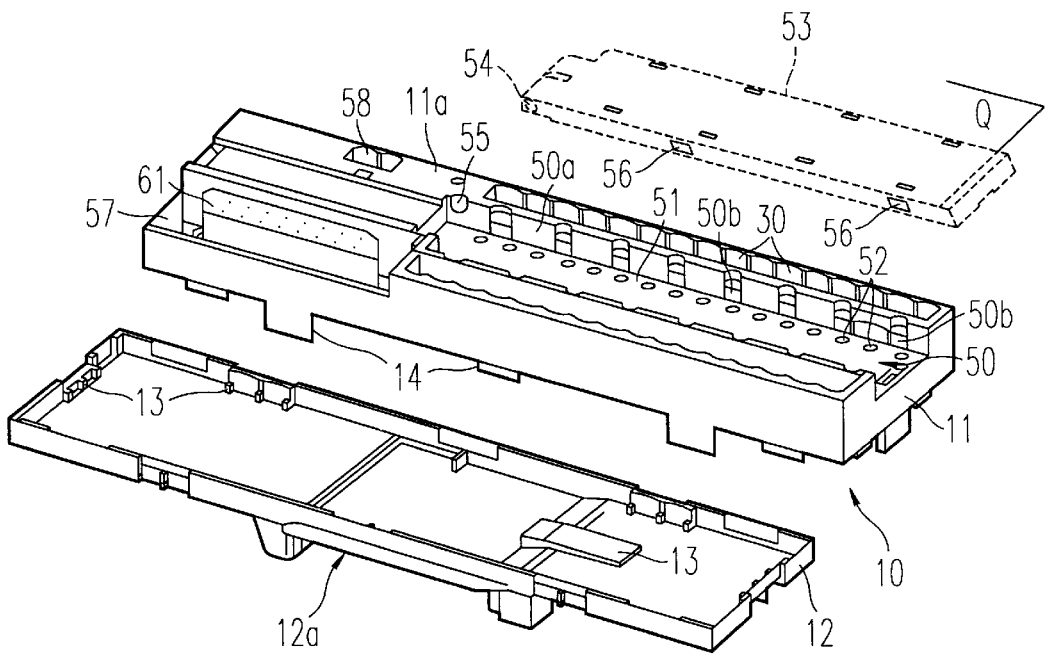
FIG. 2 is an exploded perspective view of an interface device.

The interface device 1 shown in FIG. 2 is a housing 10 with a generally parallelepiped and oblong shape. Its overall dimensions are small so that it will fit into the environment of devices 21.

The housing 10 consists of a body 11, a printed circuit board not shown on the drawings, and a base 12. The body 11 and the base 12 are made of plastic.

The base 12 is fixed at the back of body 11 to protect the printed circuit board and to close the housing body. The back is closed by attachments and click fittings 13 fitted on base 12 that work in cooperation with complementary body 11 retaining means 14.

The housing 10 comprises an attachment part 12a which consists of the rear part of its base 12. The attachment part 12a is mounted by suitable means either on a plate 21a or directly to rack 24.

The housing body 11 includes a first row of aligned connection terminals 30 longitudinally on one part of its front 11a. Preferably, there are not more than eight connection terminals, so that the size of housing 10 can be limited.

Figure 3:
FIG. 3 illustrates a connection cable suitable for being installed on the interface device in FIG. 2.

Each terminal 30 is a plug-in terminal fitted with two connection pins (not illustrated) soldered to the printed circuit. A switch 21 is connected to a terminal 30 through at least one connection cable 40 (FIG. 3) that comprises a connector 41 with two female connection elements 42 at one of its ends to plug onto the terminal connection pins. At its other end, the cable 40 is fitted with a connector 43 adapted to the switch 21 connection type. Beneficially, this connector slides along the cable to adapt the cable length between the device 1 and switch 21; when the length has been determined, the connector is fixed on the cable by appropriate tightening means, the connector preferably being self-stripping.

Furthermore, the body 11 comprises a central and longitudinal recess 50, approximately the same length as the row of terminals 30, above the printed circuit board.

The recess 50 has a bottom 51 that comprises a row of aligned orifices 52 laid out laterally facing the connection terminals 30. The orifices 52 correspond to electrically conducting elements on the printed circuit board, such as conducting tracks, which are connected to the connection pins of terminals 30. The conducting parts are thus accessible for an electrical test of terminals 30 through orifices 52.

The bottom 51 also has a pre-prepared electrical marking label for each connection terminal 30.

The depth of the recess 50 is such that a pivoting cover 53 can be added such that its front plane Q is flush with the front 11a of the body 11 in the closed position. The cover 53 and the longitudinal side walls 50a of the recess 50 have pivots 54 and notches 55 at their ends, that can cooperate with each other to form the cover hinge. The cover 53 is closed by tabs 56 that click fit into openings 50b formed in the side walls 50a of the central recess.

The cover 53 is preferably transparent so that the pre-prepared marking label at the bottom 51 of the recess 50 is visible. However, the transparent cover may have an electrical marking label specific to the user affixed to it, that slides between the shoulders located on the inside surface of the cover.

A second row of aligned connection terminals 30 may be provided parallel to the first row and symmetric to recess 50. Consequently additional test orifices 52 are formed in the bottom 51.

The body 11 of the housing comprises an opening 57 included in the front 11a to allow passage of a connector 61, for example a multi-pin connector, between the processing unit 20 which is mounted on the printed circuit board. The electrical connection is made using the adapted electrical cable 60 fitted with a complementary multi-pin connector. The connector 61 and the electrical cable 60 may be adapted to a connection for a factory bus, for example of the AS-Interface type, as a variant.

If a multi-pin connector is used, then a distribution housing 70 is provided between the interface device 1 and the unit 20, to connect the electrical cable 60 to it, information from or to the unit 20 on housing 70 then being transmitted through two separate cables adapted to the unit inputs.

Finally, at the opening 57 end, the housing front 11a may be provided with an additional opening 58 through which a low voltage power supply type connector can be passed, installed on the printed circuit board. This connector may be used to power a given type of device 21.

The arrangement of the electrical connection of devices to the processing unit through the interface device in the enclosure is as follows:

The processing unit 20 is installed inside the cabinet, while devices 21 and the interface device 1 are fixed to the rack 24 on wall 23. The interface device 1 is installed as close as possible to devices 21 such that the length of the connection cables 40 is minimized.

Obviously, several interface devices 1 may be added, depending on the number of devices 21 to be installed.

The connection cables 40 are firstly wired to devices 21, their associated ends being adapted to the type of terminals for each device.

The installer can then write an electrical marking label notifying all device connections and can slide it in the transparent cover 53 of the interface device.

Cables 40 are then transferred to the device 1, where their ends 41 are plugged into terminals 30.

Finally, the interface device 1 is connected to unit 20 through electrical cable 60.

Note that depending on its function, a switch 21 will be connected by at least one connection cable 40 that includes a forward conducting line and a return conducting line, such that there is no need to use two separate cables or wires as in prior art. Consequently, this type of cable means that a simple marking element can be affixed to connector 41, and for example may be marked with the function of device 21 instead of the cable destination, whereas for wire to wire type wiring each wire has to be marked since it is essential to mark its destination.

We claim:

1. Enclosure for electrical switching equipment including electrical control or display devices (21) supported on a wall (23) of the enclosure, being accessible from the outside, a processing or control unit (20) for these devices which is housed inside the enclosure, and an electrical interface device (1) between the devices (21) and the unit (20), the interface device (1) being composed of a housing (10) comprising a body (11) that houses a printed circuit board and encloses a row of connection terminals (30) and a connector (61) to connect the printed circuit board to the devices (21) and to unit (20) respectively, characterized in that the interface device (1) comprises an attachment part (12a) installed on the inside of the enclosure wall (23) close to the devices (21), and the terminals (30) on the device (1) are of the quick fit type.

2. Enclosure according to claim 1, characterized in that the wall (23) includes a rack (24) on its inside surface, on which the support plates (21a) for electrical devices (21) are mounted, one of the plates (21a) acting as an attachment support for the interface device (1).

3. Enclosure according to claim 1, characterized in that the inside surface of the wall (23) supports a rack (24) on which the interface device (1) is fixed.

4. Enclosure according to claim 1, characterized in that the interface device terminals (30) are of the connection pins type and the electrical connection between the terminals (30) and the devices (21) is made using connection cables (40), each fitted with a connector (41) at at least one of their ends, and this connector plugs into the connection pins of a terminal (30).

5. Enclosure according to claim 4, characterized in that each connection terminal (30) of the interface device comprises two connection pins, and the connector (41) associated with it comprises two corresponding female connection elements (42), that plug onto the two connection pins respectively.

6. Enclosure according to claim 1, characterized in that the body (11) of the interface device comprises a recess (50) approximately the same length as the row of terminals (30), the said recess comprising a bottom (51) located above the printed circuit board and which includes orifices (52) placed on the side of each of the connection terminals (30) corresponding to the electrically conducting elements of the printed circuit board to make them accessible for electrical tests, the conducting parts being connected to the connection terminals.

7. Enclosure according to claim 6, characterized in that the body (11) of the interface device includes a second longitudinal row of connection terminals parallel to the first row of terminals and symmetric to the recess (50), the bottom (51) of the central recess comprising additional test orifices (52) associated with the second row of terminals.

8. Enclosure according to claim 6, characterized in that the recess (50) in the interface device is closed by a cover (53), the front of which is adapted so that an electrical connection terminal marking label specific to the user can be placed on it.

9. Enclosure according to claim 8, characterized in that the cover (53) is installed pivoting on pivots (54) supported by the ends of the sides of the recess (50) and with tabs (56) that click fit into openings (50b) formed in the walls of the recess.

10. Enclosure according to claim 1, characterized in that the body (11) of the interface device comprises an opening (58) for passing a low voltage power supply pin fitted on the printed circuit board.

11. Enclosure according to claim 4, characterized in that the connection cable (40) is fitted with a self-stripping connector (43) at its other end, capable of sliding along the cable before the cable length necessary for wiring has been determined.

* * * * *